United States Patent
Sun et al.

(10) Patent No.: US 7,878,689 B2
(45) Date of Patent: Feb. 1, 2011

(54) LIGHT SOURCE PACKAGE STRUCTURE

(75) Inventors: Yi-Ting Sun, Taipei (TW); Po-Hung Yao, Kaohsiung County (TW); Heng-Chun Huang, Miaoli (TW); Hsiu-Chen Hsu, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/714,255

(22) Filed: Feb. 26, 2010

(65) Prior Publication Data

US 2010/0149821 A1   Jun. 17, 2010

Related U.S. Application Data

(62) Division of application No. 11/520,765, filed on Sep. 14, 2006, now Pat. No. 7,699,504.

(30) Foreign Application Priority Data

Dec. 20, 2005 (TW) .............................. 94145193 A
May 26, 2006 (TW) .............................. 95118691 A

(51) Int. Cl.
*F21V 5/00* (2006.01)
(52) U.S. Cl. .................. 362/331; 362/327; 362/332
(58) Field of Classification Search ................. 362/244, 362/268, 311.02, 311.04, 311.06, 311.14, 362/311.15, 326, 327, 329, 331, 332, 335, 362/336, 337, 339, 340
See application file for complete search history.

(56) References Cited

U.S. PATENT DOCUMENTS

| | | | |
|---|---|---|---|
| 1,282,617 A | * | 10/1918 | Mygatt .................. 362/331 |
| 2,554,584 A | | 5/1951 | Metz |
| 4,264,948 A | | 4/1981 | Cherouge |
| 4,780,798 A | | 10/1988 | Iida |

(Continued)

FOREIGN PATENT DOCUMENTS

TW    M270491 U    7/2005

*Primary Examiner*—Y My Quach Lee
(74) *Attorney, Agent, or Firm*—Birch, Stewart, Kolasch & Birch, LLP

(57) ABSTRACT

The present invention relates to a light source package structure, which comprises: an accommodating space for accommodating a light source, a first refraction surface, and at least a second refraction surface. The first refraction surface receives light discharging from the light source while refracting the same to form a first refracting light, the upper part of the first refraction surface further comprising a refracting structure for refracting the light emitted from the light source. The second refraction surface receives and refracts the first refracting light to form a discharging light being emitted out of the light source package structure. Wherein, an included angle is formed between the normal vector of a portion of the second refraction surface and the central axis of the light source package structure. It is noted that the aforesaid package structure can be used in various packaging for improving refraction. In a preferred embodiment, a light source of light emitting diode (LED) is packaged by the light source package structure of the invention for enabling the light emitted from the LED to be discharged out of the package structure by a large angle after being refracted multiple times, so that the LED package structure can be adopted as a flat light source for diverse purpose applied in industry.

7 Claims, 15 Drawing Sheets

U.S. PATENT DOCUMENTS

| | | |
|---|---|---|
| 6,670,207 B1 | 12/2003 | Roberts |
| 6,679,621 B2 | 1/2004 | West et al. |
| 6,682,211 B2 | 1/2004 | English et al. |
| 6,908,219 B1 | 6/2005 | Reiss |
| 6,981,784 B2 | 1/2006 | Dubuc |
| 7,153,000 B2 | 12/2006 | Park et al. |
| 2002/0080615 A1* | 6/2002 | Marshall et al. ............. 362/336 |
| 2005/0254258 A1* | 11/2005 | Lee ........................... 362/612 |

* cited by examiner

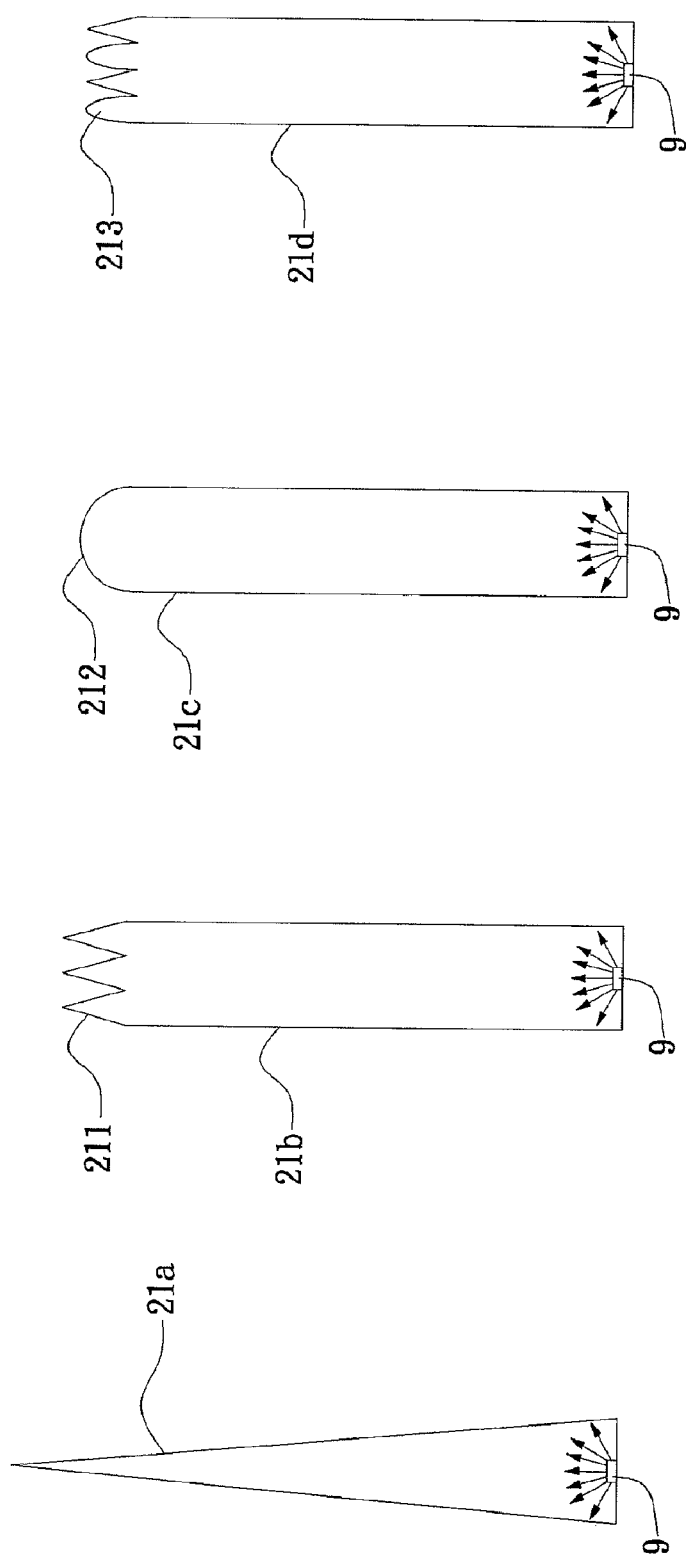

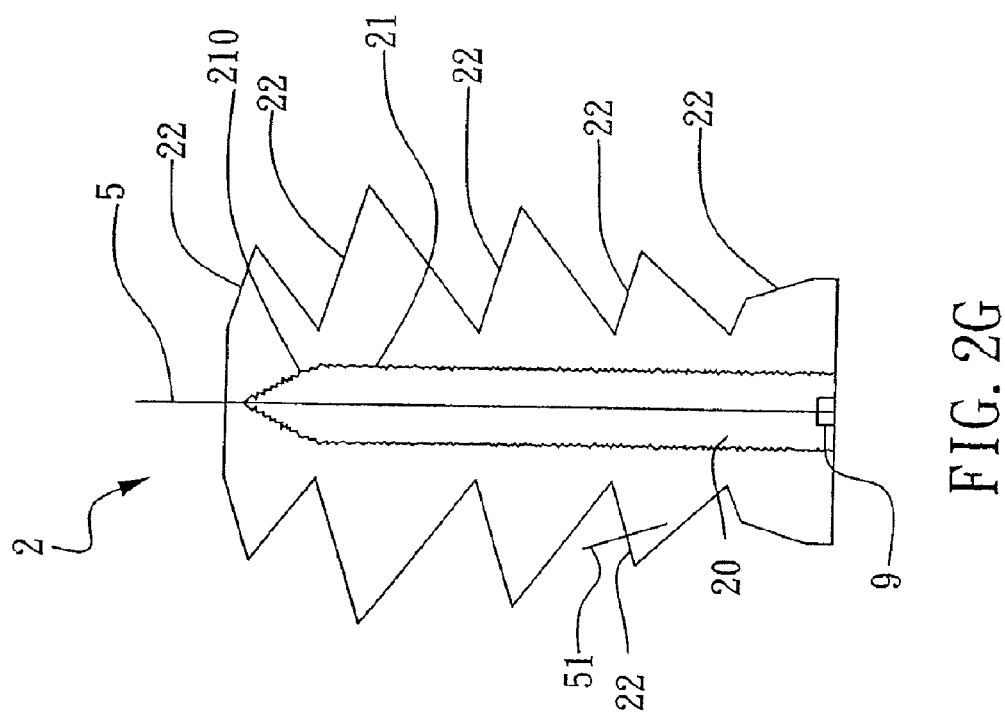

LIGHT SOURCE PACKAGE STRUCTURE

This application is a Divisional of co-pending application Ser. No. 11/520,765 filed on Sep. 14, 2006, the entire contents of which are hereby incorporated by reference and for which priority is claimed under 35 U.S.C. §120. This nonprovisional application also claims priority under 35 U.S.C. §119(a) on Patent Application Nos. 094145193 and 095118691 filed in Taiwan, R.O.C. on Dec. 20, 2005 and May 26, 2006, respectively, the entirety of which is herein incorporated by reference.

FIELD OF THE INVENTION

The present invention relates to a package structure, and more particularly, to a light source package structure capable of refracting light therein multiple times for enabling the light to be discharged out of the package structure by a large angle.

BACKGROUND OF THE INVENTION

Nowadays, it is commonly seen that backlight modules are used for electronic devices with flat panel displays, which includes devices as small as hand-held palm pilots and as large as big-screen TVs. Although most backlight modules still adopt cold cathode fluorescent lamp (CCFL), the utilization of light emitting diode (LED) as the light source of large-sized liquid crystal display (LCD) is becoming popular following the advance of LED technology. As the design challenge of a backlight module is to generate uniform illumination across the LCD surface and luminance that is high enough to produce good contrast in a day environment, LED is preferred over CCFL because it has following advantages: (1) as LED is smaller in size than that of CCFL and it is more solid than CCFL as well, not only the assembly of backlight module can be facilitated, but also the backlight modules adopting LEDs as the light source thereof are lighter and smaller comparing to those CCDL backlight modules; (2) it is noted that the color quality of LCDs adopting LED backlight module is better than that of LCDs adopting CCFL backlight module, since LED can provide a wider color gamut as it is being used in the backlight module for LCDs; (3) Comparing to the mercury-contained CCFL, LED is environmental benign.

Although LEDs are preferred, it is required to package an LED light source for enabling the light source package to generate uniform illumination across a specific surface and transferring the LED from point light source into surface light source. Please refer to FIG. 1, which is a cross-sectional view of a LED package disclosed in U.S. Pat. No. 6,679,621, entitled "Side Emitting LED and Lens". The LED package of FIG. 1 can control the direction of light beams being discharged out of the LED by disposing various refraction surfaces of different shapes at various positions on the LED package, so that the light beams can be emitted out of the LED package in a direction substantially perpendicular to the central axis of the LED package, and thus a side-emitting device with large illuminate areas can be provided. As seen in FIG. 1, light emitted from near focal point F that is directly incident on reflecting surface I is reflected from surface I to refracting surface H and refracted by surface H to exit the lens of the LED package in a direction substantially perpendicular to the central axis of the LED package. Light emitted from near focal point F that is directly incident on refracting surface 156 is refracted by surface 156 to also exit the lens in a direction substantially perpendicular to the central axis. However, it is noted that the LED package of FIG. 1 can only refract light beams emitted by the LED only once by the lens thereof, and moreover, the process for manufacturing the LED package is complicated since it not only requires a step to form a lens on top of an LED while covering the same, it also requires a step of filling the gap between the lens and the LED by a transparent material using a specific pumping-suction means.

Moreover, a LED capsule, disclosed in U.S. Pat. No. 6,682,211, entitled "Replaceable LED Lamp Capsule", uses a housing having a plurality of microstructures formed thereon for reflecting light beams emitted from a LED. However, the forgoing LED capsule is bulky that it is not suitable to be applied as the light source of LCDs.

In addition, a LED package, disclosed in U.S. Pat. No. 6,670,207, entitled "Radiation Emitter Device Having an Integral Micro-groove Lens", is able to disperse light emitted from a LED by arranging a lens with micro-grooves in front of the LED. However, as LEDs are not ideal point light sources by themselves, the dispersing of light enabled by the use of the lens with micro-grooves is not as expected, so that the LED package with lens of micro-grooves is not popular.

Therefore, there is a need for an improved LED package structure capable of overcoming the aforesaid shortcomings.

SUMMARY OF THE INVENTION

The primary object of the present invention is to provide a light source package structure capable of refracting light therein multiple times for enabling light to be emitted out of the package structure in a direction substantially perpendicular to the central axis of the light source package structure for providing a side-emitting light-emitting device.

To achieve the above object, the present invention provides a light source package structure, comprising: an accommodating space, for accommodating a light source; a first refraction surface, having at least a tapered structure formed at the upper portion of the same, for receiving light discharging from the light source while refracting the same to form a first refracting light; and at least a second refraction surface, for receiving and refracting the first refracting light to form a first discharging light being emitted out of the light source package structure.

Preferably, the tapered structure can be a pyramid or a corn.

Preferably, the first refraction surface is substantially the exterior of a first lens containing the accommodating space therein for enabling the exterior of the light source to be tightly attached to the interior of the accommodating space while sealing the same.

Preferably, the second refraction surface can be shaped like a round-tipped structure or a tapered structure, whereas the tapered structure can be a pyramid or a corn, and the profile of the round-tipped structure can be defined by an arc.

Preferably, the first refraction surface is designed as a rugged surface.

Preferably, the second refraction surface is designed as a rugged surface.

Preferably, a flat light source can be configured by arranging an array of the light source package structures in a matrix while the matrix is covered and sealed by a material of diffusion capability.

Preferably, a refraction cap is formed on top of the second fraction surface while enabling the refraction cap to receive and refract the portion of the first refracting light failed to incident to the second fraction surface and thus form a second discharging light emitting therefrom. Moreover, the refraction cap further comprises: a third refraction surface, for receiving and refracting the portion of the first refracting light failed to incident to the second fraction surface and thus forming a second refracting light; a fourth refraction surface, connected to the third refraction surface, for receiving and refracting the second refracting light so as to form a third refracting light; and a fifth refraction surface, connected to the fourth and the second refraction surfaces, for receiving and refracting the third refracting light so as to form a third refracting light so as to form the second discharging light.

Preferably, the light source package structure further comprises: a refraction cap, disposed outside the second refraction surface while covering the same, for receiving and reflecting the first and the second discharging light incident thereon and thus forming a third discharging light.

Preferably, a layer of transparent material is coated on the exterior of the light source.

Preferably, an included angle is formed between the normal vector of a portion of the second refraction surface and the central axis of the light source package structure, whereas the included angle is ranged between 0 degree and 180 degrees.

Moreover, to achieve the above object, the present invention provides another light source package structure, comprising: an accommodating space, for accommodating a light source; a first refraction surface, having at least a round-tipped structure formed at the upper portion of the same, for receiving light discharging from the light source while refracting the same to form a first refracting light; and at least a second refraction surface, for receiving and refracting the first refracting light to form a first discharging light being emitted out of the light source package structure.

Furthermore, to achieve the above object, the present invention provides further another light source package structure, comprising: an accommodating space, for accommodating a light source; a first refraction surface, having at least a tapered structure and at least a round-tipped structure formed at the upper portion of the same, for receiving light discharging from the light source while refracting the same to form a first refracting light; and at least a second refraction surface, for receiving and refracting the first refracting light to form a first discharging light being emitted out of the light source package structure.

In addition, to achieve the above object, the present invention provides a light source package structure, comprising: an accommodating space, for accommodating a light source; a first refraction surface, for receiving light discharging from the light source while refracting the same to form a first refracting light; at least a second refraction surface, for receiving and refracting the first refracting light to form a first discharging light being emitted out of the light source package structure; and a reflection surface, connected to the at least one second refraction surface, for reflecting the portion of the first refracting light emitted from the top of the first refraction surface while enabling the reflected first refracting light to incident to the second refraction surface.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 2C to FIG. 2F illustrate profiles of the first refraction surface capable of being employed by the light source package structure of FIG. 2B.

FIG. 2G is a cross sectional view of a light source package structure having a rugged first refraction surface.

DESCRIPTION OF THE PREFERRED EMBODIMENT

For your esteemed members of reviewing committee to further understand and recognize the fulfilled functions and structural characteristics of the invention, several preferable embodiments cooperating with detailed description are presented as the follows.

Figure 1:
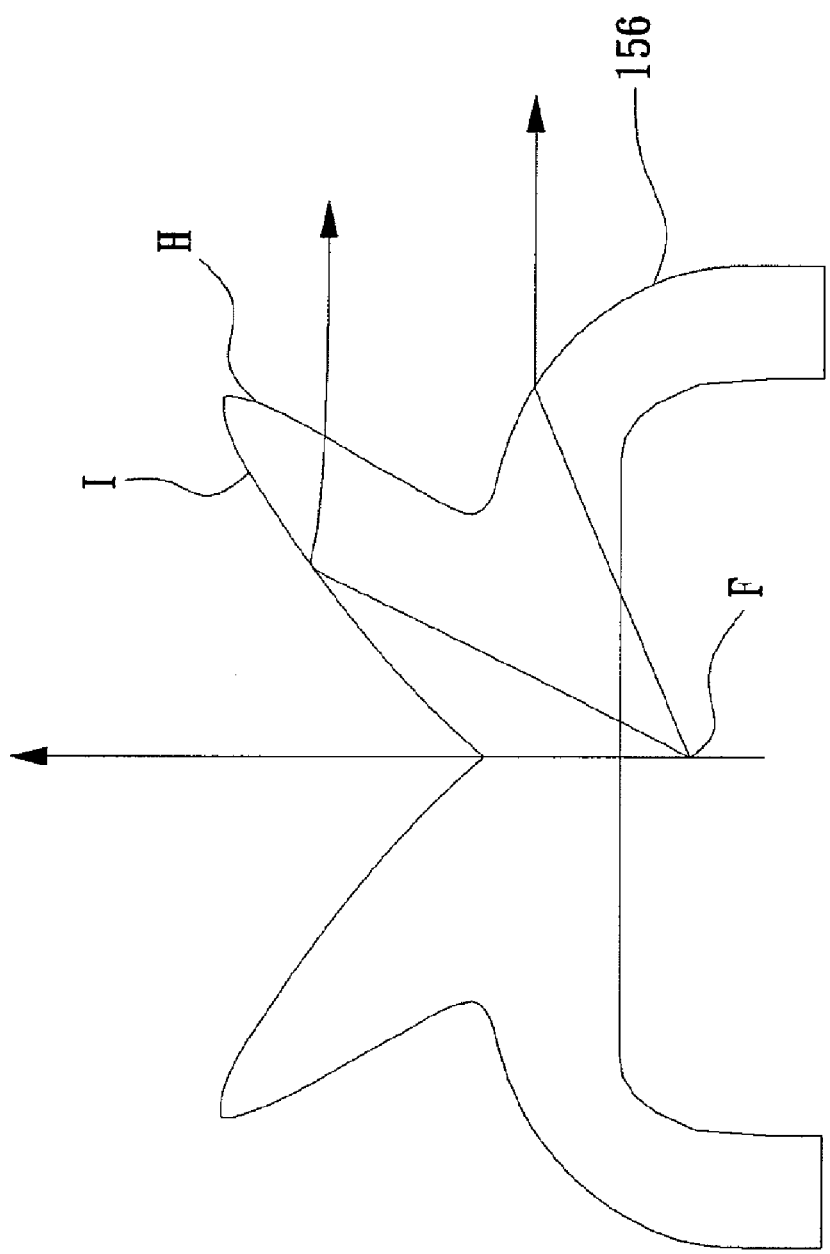
FIG. 1 is a schematic diagram illustrating a conventional LED package disclosed in U.S. Pat. No. 6,679,621.
Figure 2A:
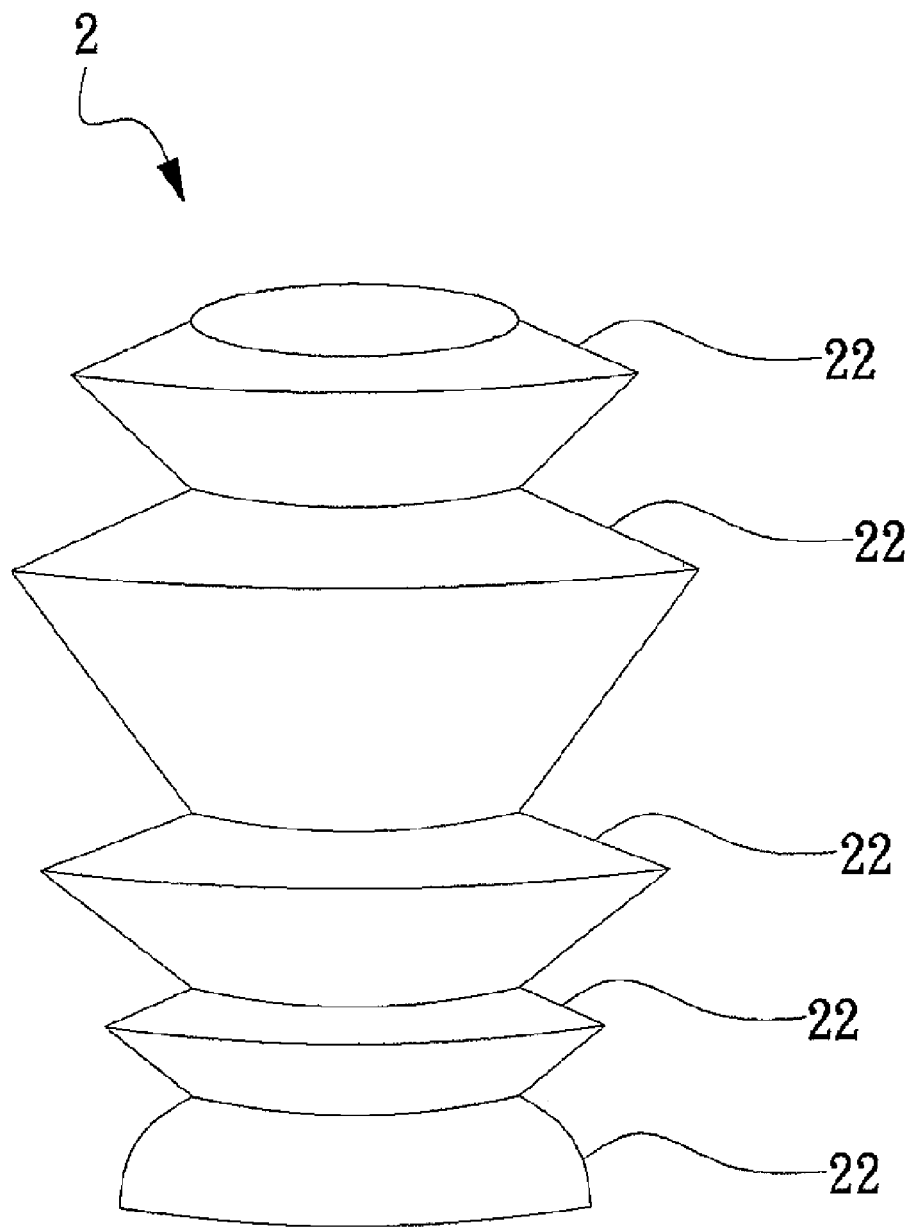
FIG. 2A is a three-dimensional diagram showing a light source package structure according to a first preferred embodiment of the invention.
Figure 2B:
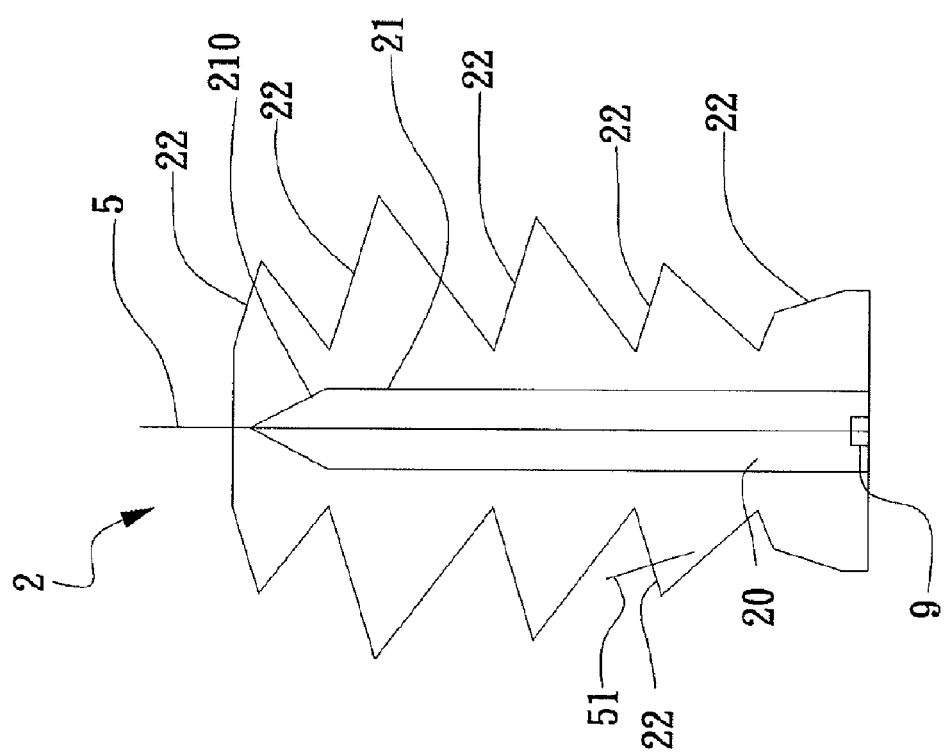
FIG. 2B is a cross sectional view of FIG. 2A.

Please refer to FIG. 2A and FIG. 2B, which are respectively a three-dimensional view and a cross-sectional view of a light source package structure according to a first embodiment of the invention. The light source package structure 2 is comprised of an accommodating space 20 for accommodating a light source 9, a first refraction surface 21, and at least a second refraction surface 22. The first refraction surface is disposed superimposing the light source 9 for receiving light discharging from the light source 9 while refracting the same to form a first refracting light, the upper part of the first refraction surface further comprising a refracting structure for refracting the light emitted from the light source, in which at least a tapered structure 210 is formed at the upper portion of the first refraction surface 21 while the first refraction surface 21 is substantially the exterior of a first lens containing the accommodating space 20 therein for enabling the exterior of the light source 9 to be tightly attached to the interior of the accommodating space 20 while sealing the same. It is noted that the tapered structure 210 is a structure can be a pyramid and a corn.

The light source 9 shown in FIG. 2A can be a simple LED or a LED coated with a layer of conventional transparent material, such as polymethyl methacrylate (PMMA) and resins of the like, as those disclosed in TW Pat. No. M270491. Moreover, each of the second refraction surfaces 22 is used for receiving and refracting the first refracting light to form a first discharging light being emitted out of the light source package structure 2 in a direction perpendicular to the central axis of the light source package structure 2. Wherein, an included angle is formed between the normal vector 51 of a portion of the second refraction surface 22 and the central axis of the light source package structure 2, whereas the included angle is ranged between 0 degree and 180 degrees.

Please refer to FIG. 2C to FIG. 2F, which illustrate profiles of the first refraction surface capable of being employed by the light source package structure of FIG. 2B. There are a variety of structures that can be formed on the upper portion of the first refraction surface for refracting light in a direction proximate to perpendicular to the central axis of the light source package structure. In FIG. 2C, the profile of the first refraction surface 21*a* is shaped like a corn or pyramid, such that light beams cab be refracted thereby in a direction perpendicular to the central axis of the light source package structure. In FIG. 2D, a sawtooth structure 211 comprising a plurality of pyramids is formed at the upper portion of the first refraction surface 21*b*. In FIG. 2E, at least a round-tipped structure with a specific curvature 212 is formed at the upper portion of the first refraction surface 21*c*. It is noted that a combination 213 of a plurality of tapered structures and a plurality of round-tipped structures can be formed at the upper portion of the first refraction surface 21*d*, as seen in FIG. 2F. In addition, both the first and the second refraction surfaces can be designed as rugged surfaces illustrated in FIG. 2G.

Figure 3B:
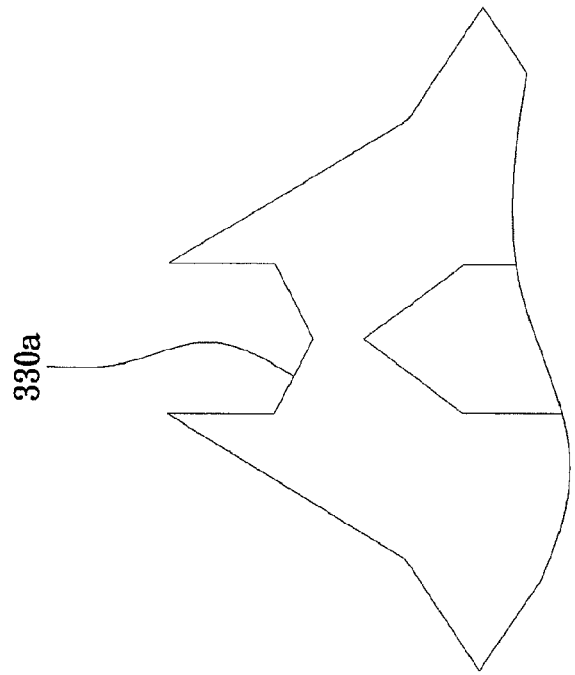
FIG. 3B illustrates the structure of the refraction cap used in the light source package structure of FIG. 3A.
Figure 3A:
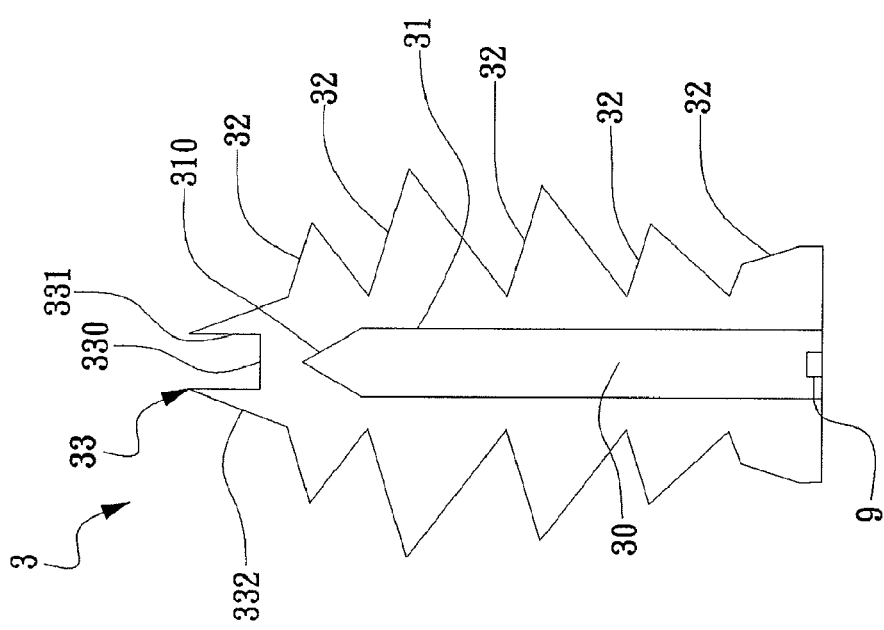
FIG. 3A is a cross sectional view of a light source package structure according to a second preferred embodiment of the invention.

Please refer to FIG. 3A, which is a cross sectional view of a light source package structure according to a second preferred embodiment of the invention. The light source package structure 3 is comprised of: an accommodating space 30 for accommodating a light source 9; a first refraction surface 31, covering the light source 9 for receiving light discharging from the light source 9 while refracting the same to form a first refracting light; a second refraction surface 32, for receiving and refracting the first refracting light to form a first discharging light being emitted out of the light source package structure 3; and a refraction cap 33, being formed on top of the second fraction surface 32 while enabling the refraction cap 33 to receive and refract the portion of the first refracting light failed to incident to the second fraction surface and thus form a second discharging light emitting therefrom; wherein an included angle, being ranged between 0 degree and 180 degrees, is formed between the normal vector of a portion of the second refraction surface 32 and the central axis of the light source package structure 3.

In the embodiment shown in FIG. 3A, the refraction cap 33 is comprised of: a third refraction surface 330, for receiving and refracting the portion of the first refracting light failed to incident to the second fraction surface 32 and thus forming a second refracting light; a fourth refraction surface 331, connected to the third refraction surface 330, for receiving and refracting the second refracting light so as to form a third refracting light; and a fifth refraction surface 332, connected to the fourth and the second refraction surfaces 331, 32, for receiving and refracting the third refracting light so as to form the second discharging light. By the disposition of the refraction cap 33, light beams, before being emitted from the top of the light source package structure 3, are being refracted at least two times more than those without the refraction cap 33, so that the emitting light is refracted by a large angle and thus almost perpendicular to the central axis of the light source package structure 3. In FIG. 3A, the normal vector of a portion of the third refraction surface 330 is parallel to the central axis of the light source package structure 3. In FIG. 3B, for increasing the angle of the first refracting light incident to the third refraction surface 330*a* where it is refracted by a comparatively larger angle to form the second refracting light, the profile of the third refraction surface 330*a* can be the profile of pyramid or corn.

Figure 4:
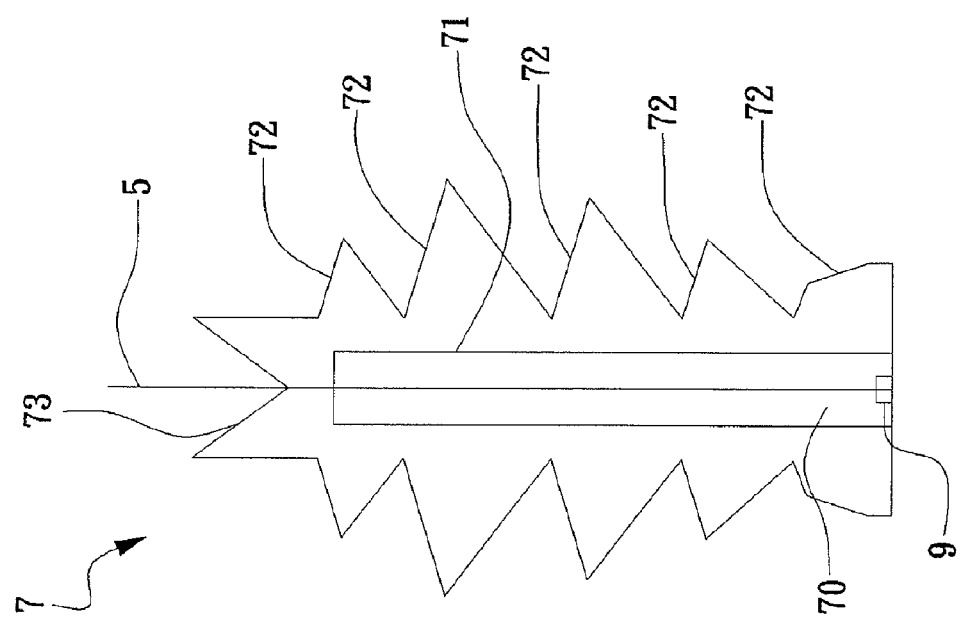
FIG. 4 is a cross sectional view of a light source package structure according to a third preferred embodiment of the invention.

Please refer to FIG. 4, which is a cross sectional view of a light source package structure according to a third preferred embodiment of the invention. The light source package structure 7 of FIG. 4 is comprised of: an accommodating space 70 for accommodating a light source 9; a first refraction surface 71; at least a second refraction surface 72; and a reflection surface 73. The first refraction surface 71 is placed to cover the light source 9 for receiving light discharging from the light source 9 while refracting the same to form a first refracting light, whereas the first refraction surface 71 is shaped like a column. The light source 9 can be a simple LED or a LED coated with a layer of conventional transparent material. The second refraction surface 72 is used for receiving and refracting the first refracting light to form a first discharging light being emitted out of the light source package structure 7 in a parallel manner, whereas an included angle is formed between the normal vector of a portion of the second refraction surface 72 and the central axis of the light source package structure 7. The reflection surface 73 is disposed at the upper portion of the light source package structure 7 and is connected to the second refraction surface 72 for reflecting the portion of the first refracting light emitted from the top of the first refraction surface 71 while enabling the reflected first refracting light to incident to the second refraction surface 72. It is noted that each of the first refraction surface 71, the second refraction surface 72 and the reflection surface 73 can be a tapered structure or a round-tipped structure, while all being designed as rugged surfaces. In addition, the first refraction surface 71 is substantially the exterior of a first lens containing the accommodating space 70 therein for enabling the exterior of the light source 9 to be tightly attached to the interior of the accommodating space while sealing the same, which is similar to that shown in prior embodiment and thus is not describe further herein.

Figure 5A:
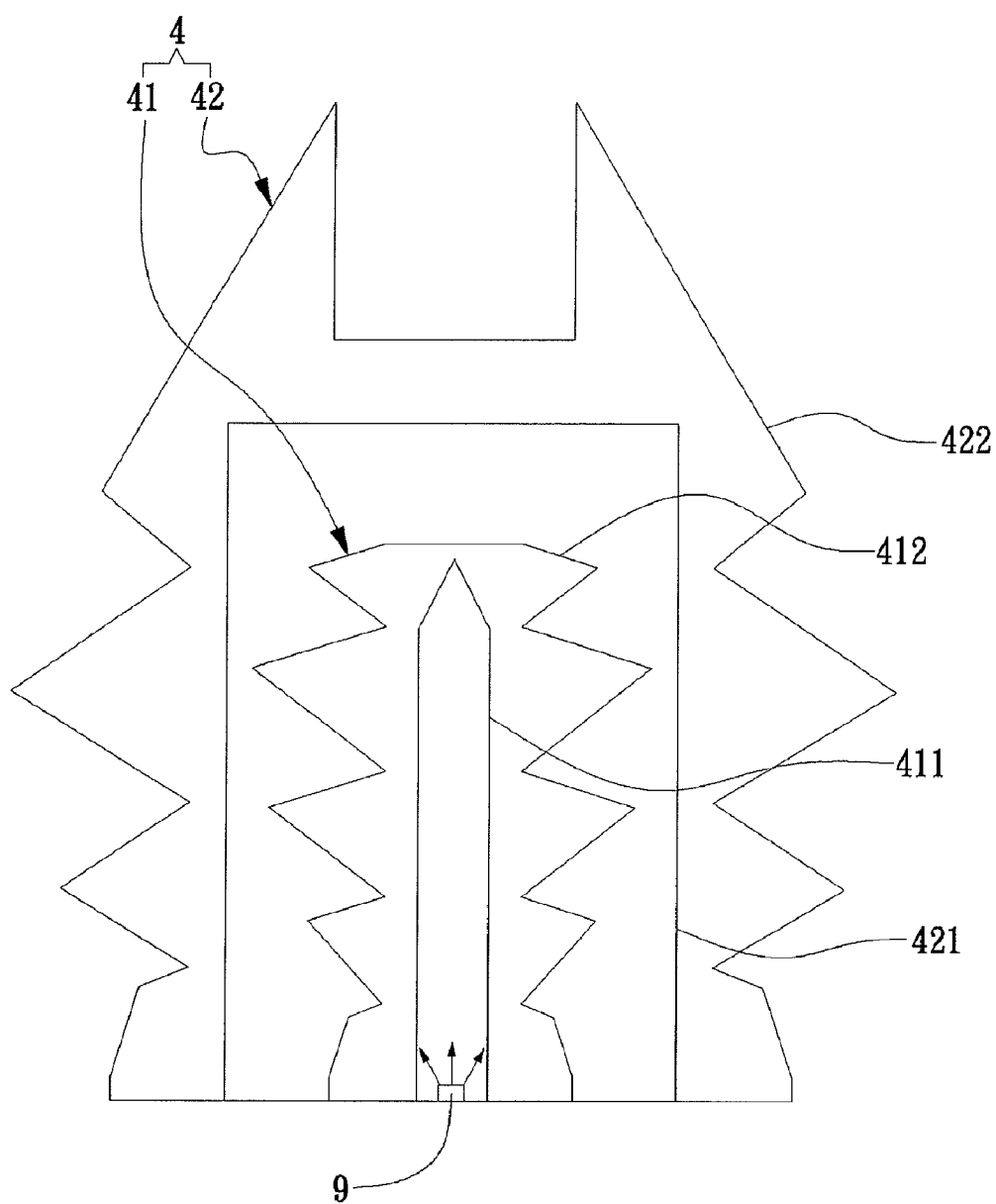
FIG. 5A and FIG. 5B are cross sectional views of light source package structures according to a fourth preferred embodiment of the invention, whereas the two light source package structures have refraction packages of different design.
Figure 5B:
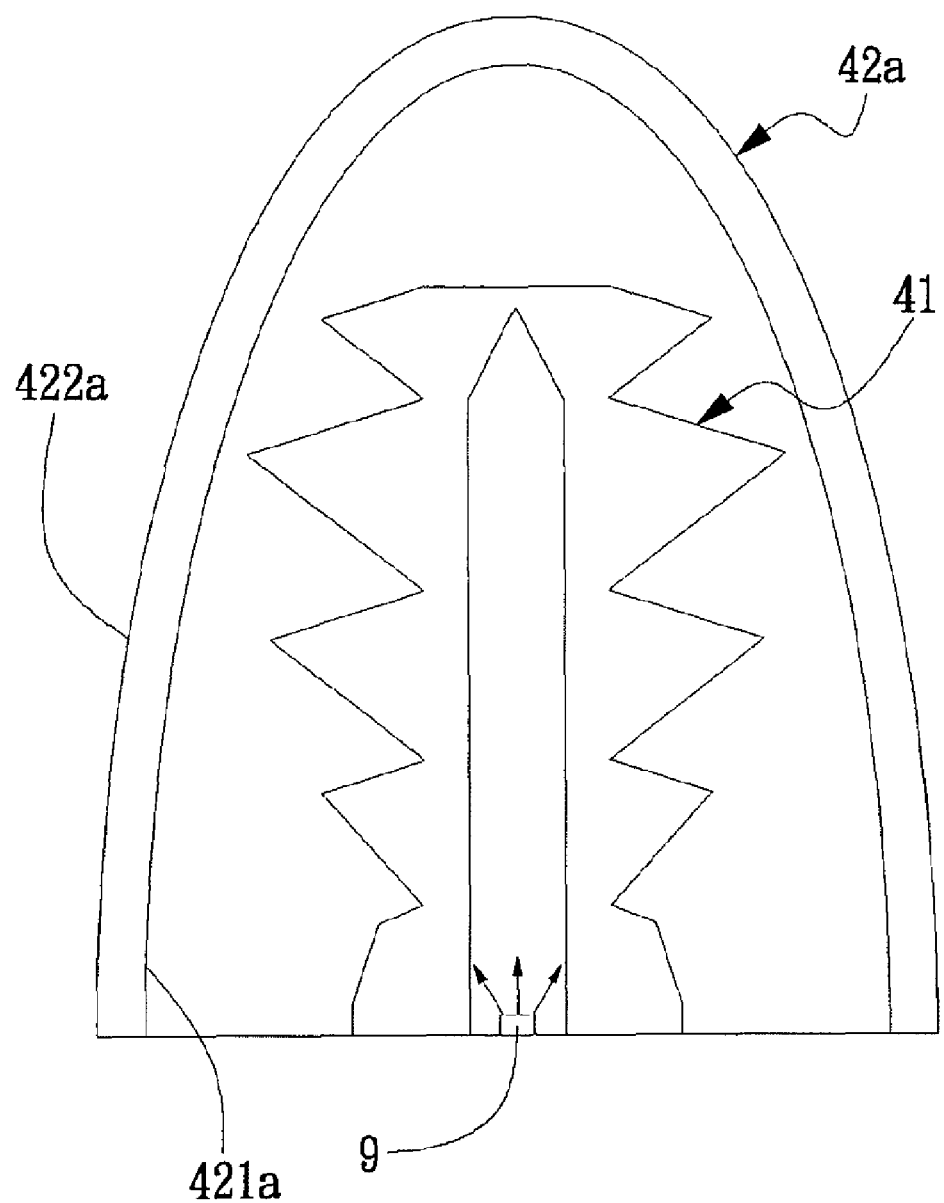

FIG. 5A and FIG. 5B are cross sectional views of light source package structures according to a fourth preferred embodiment of the invention, whereas the two light source package structures have refraction packages of different design. As the key of the invention is to design a light source package structure capable of refracting light beams emitted from a LED more than once, a refraction package 42 is disposed outside the second refraction surface of those prior embodiments, while covering the same for receiving and reflecting the first and the second discharging light incident thereon and thus forming a third discharging light, as seen in FIG. 5A. In FIG. 5A, the light source package structures, disclosed in FIG. 2A, FIG. 3A, FIG. 4, are defined to be a first refracting part 41, while enabling the first refracting part 41 to be covered by at least a refraction package 42, so that the light of the light source 9 is first refracted by the first refracting part 41 and then further being refracted by the refraction package 42, by which light can be discharged out of the light source package structure of FIG. 5A more close to a direction perpendicular to the central axis thereof. As seen in FIG. 5A and FIG. 5B, the first refracting part 41 is composed of a first refraction surface 411 and a second refraction surface 412, by which the light refracted by the first refraction surface 411 is directed to the second refraction surface 412 where it is being refracted again and incident to the refraction package 42. Generally, the top of the first refracting part 41 can be designed as a reflection surface, which is used for reflecting the portion of the first refracting light of the first refraction surface 411 while enabling the reflected first refracting light to incident to the second refraction surface 412.

Moreover, the refraction package 42 can be structured similar to those shown in forgoing embodiments that it is comprised of a sixth refraction surface 421 and a seventh refraction surface 422, wherein the light discharged out of the first refracting part 41 can be refracted by the sixth and the seventh refraction surfaces in a successive manner. In the embodiment shown in FIG. 5A, the structure of the refraction package 42 is the same as that of the first refracting part 41.

However, the structure of the refraction package 42a can be different from that of the first refracting part 41, as shown in FIG. 5B. The refraction package 42a is substantially a curved screen covering the first refracting part 41 for receiving the light discharged out of the first refracting part 41 while refracting the same, in which the refraction package 42a is further comprised of: a sixth refraction surface 421a, for or receiving the light discharged out of the first refracting part 41 while refracting the same; and a seventh refraction surface 422a, for receiving the light discharged out of the sixth refraction surface 421a while refracting the same. It is noted that the refraction package 42a is designed to refract the light discharged out of the first refracting part 41 more than twice and thus improved the effect of refraction desired by the light source package structure.

Figure 6A:
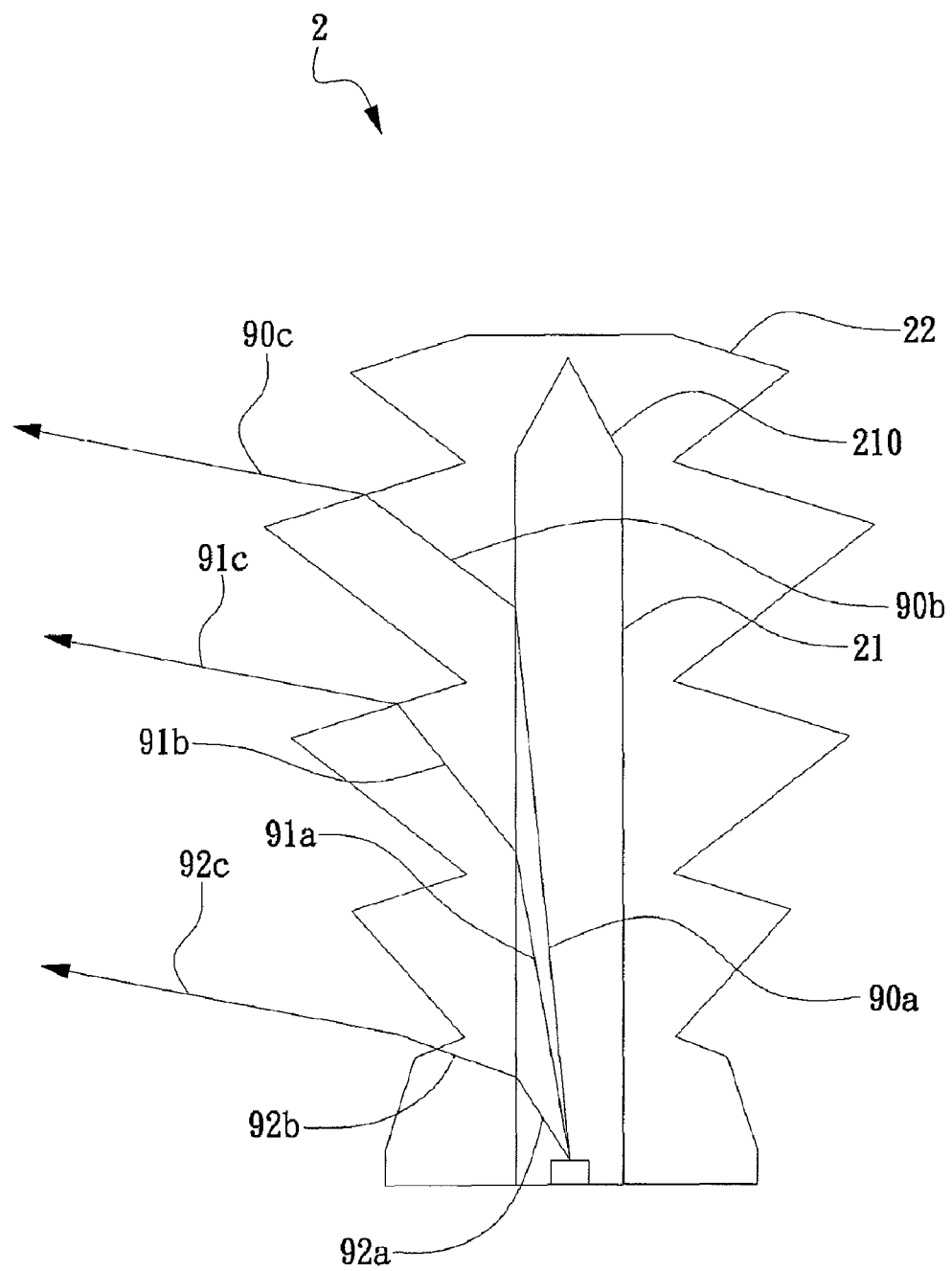
FIG. 6A and FIG. 6B are schematic diagrams depicting paths of light being refracted by a light source package structure of the invention.
Figure 6B:
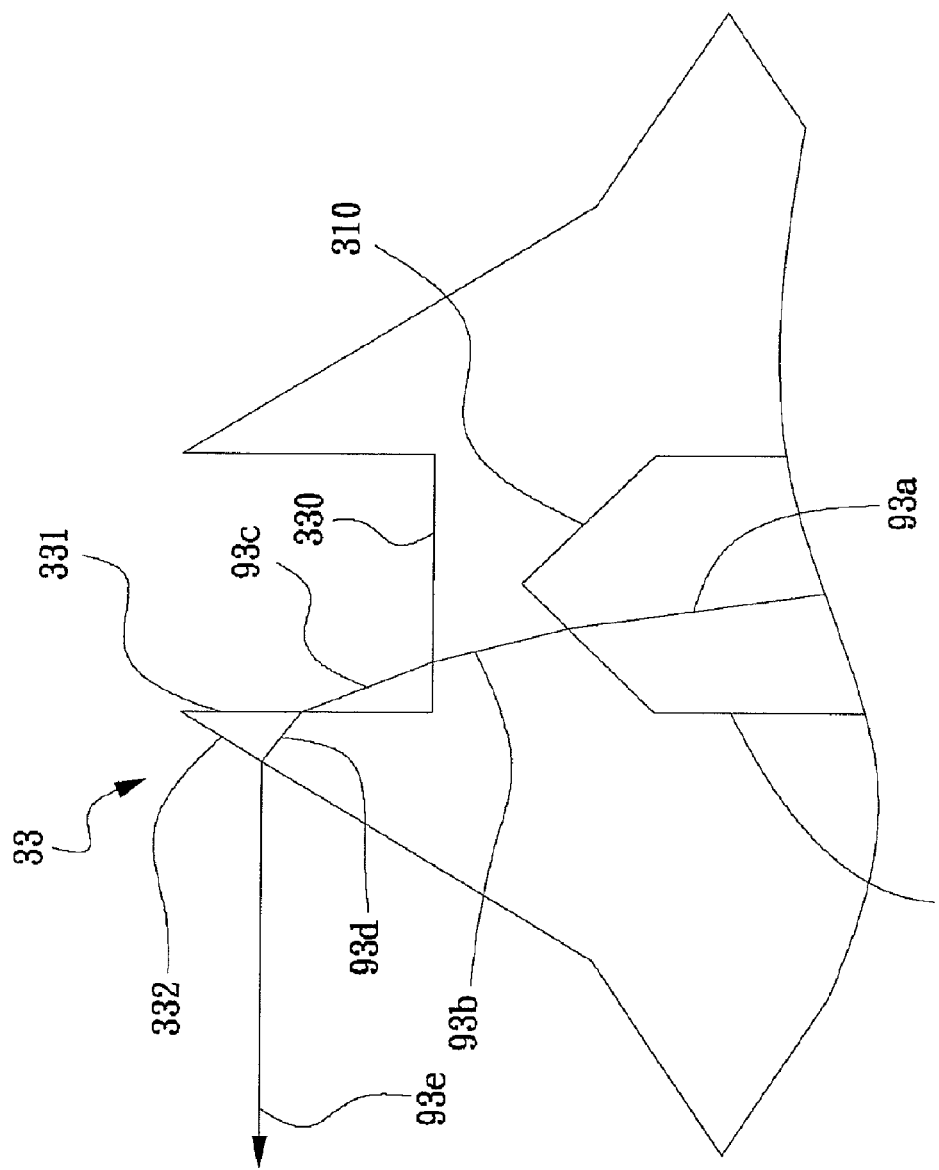

FIG. 6A and FIG. 6B are schematic diagrams depicting paths of light being refracted by a light source package structure of the invention. In FIG. 6A, when the light beams 90a, 91a, 92a emitted from the light source composed of LEDs are respectively incident to their corresponding portions of the first refraction surface 21, they are refracted toward the normal vector of its corresponding portion and forming three first refracting light beams 90b, 91b, 92b accordingly as each of the light beams 90a, 91a, 92a is traveling from a sparse media into a dense media. Thereafter, the three first refracting light beams 90b, 91b, 92b are further respectively incident to their corresponding portion of the second refraction surface 22, they are refracted away from the normal vector of its corresponding portion and forming three discharging light beams 90c, 91c, 92c accordingly as each of the light beams 90b, 91b, 92b is traveling from a dense media into a sparse media. Eventually, by the abovementioned two refraction, the three discharging light beams 90c, 91c, 92c, are directed to travel in a direction perpendicular to the central axis of the light source package structure 2.

In FIG. 6B, a refraction cap is arranged at the upper portion of the light source package structure and is designed to receive the portion of the first refracting light failed to incident to the second fraction surface directly so as to form a second discharging light to be emitted therefrom in a direction perpendicular to the central axis of the light source package structure. First, when the light beam 93a emitted from a LED is incident to its corresponding portion of the tapered structure 310 of the first refraction surface 31, it is refracted toward the normal vector of its corresponding portion and forming a first refracting light beams 93b as it is traveling from a sparse media into a dense media. Following, as the first refracting light 93b is passing through the third refraction surface 330, that is, the first refracting light 93b is traveling from a dense media into a sparse media, it is refracted away from the normal vector of its corresponding portion of the third refraction surface 330 incident thereby and forming a second refracting light 93c. It is noted that the second refracting light 93c still can not be refracted enough to discharge out of the light source package structure in a direction perpendicular to the central axis of the light source package structure since the original light beam 93a is discharged toward the top of the light source package structure in a direction almost parallel to the central axis. Therefore, the second refracting light 93c is refracted once again by the fourth refraction surface 331 to form a third refracting light 93d, and then the third refracting light 93 is once again directed to incident to a fifth refraction surface 332 to be refracted and form a discharging light to be emitted out of the light source package structure in a direction perpendicular to the central axis of same. In the embodiment shown in FIG. 6B, both the fourth and the fifth refraction surfaces can be designed as irregular surfaces or rugged surfaces.

Figure 7A:
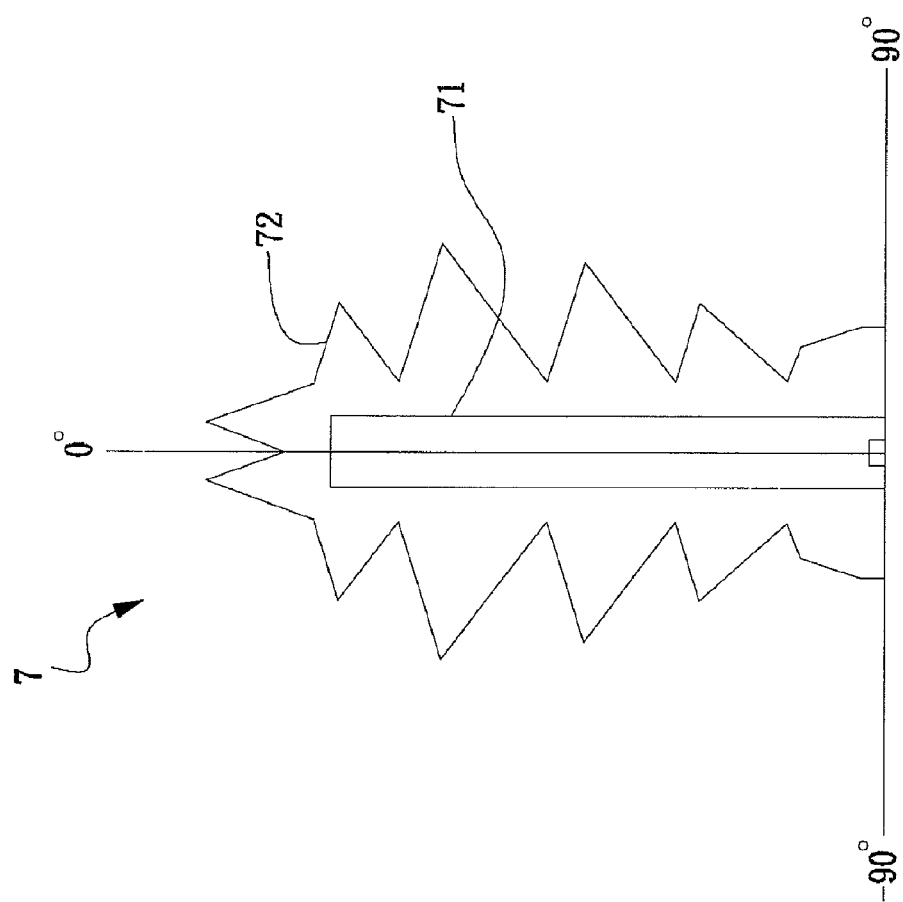
FIG. 7A is used to define the viewing angle with reference to a light source package structure of the invention.
Figure 7B:
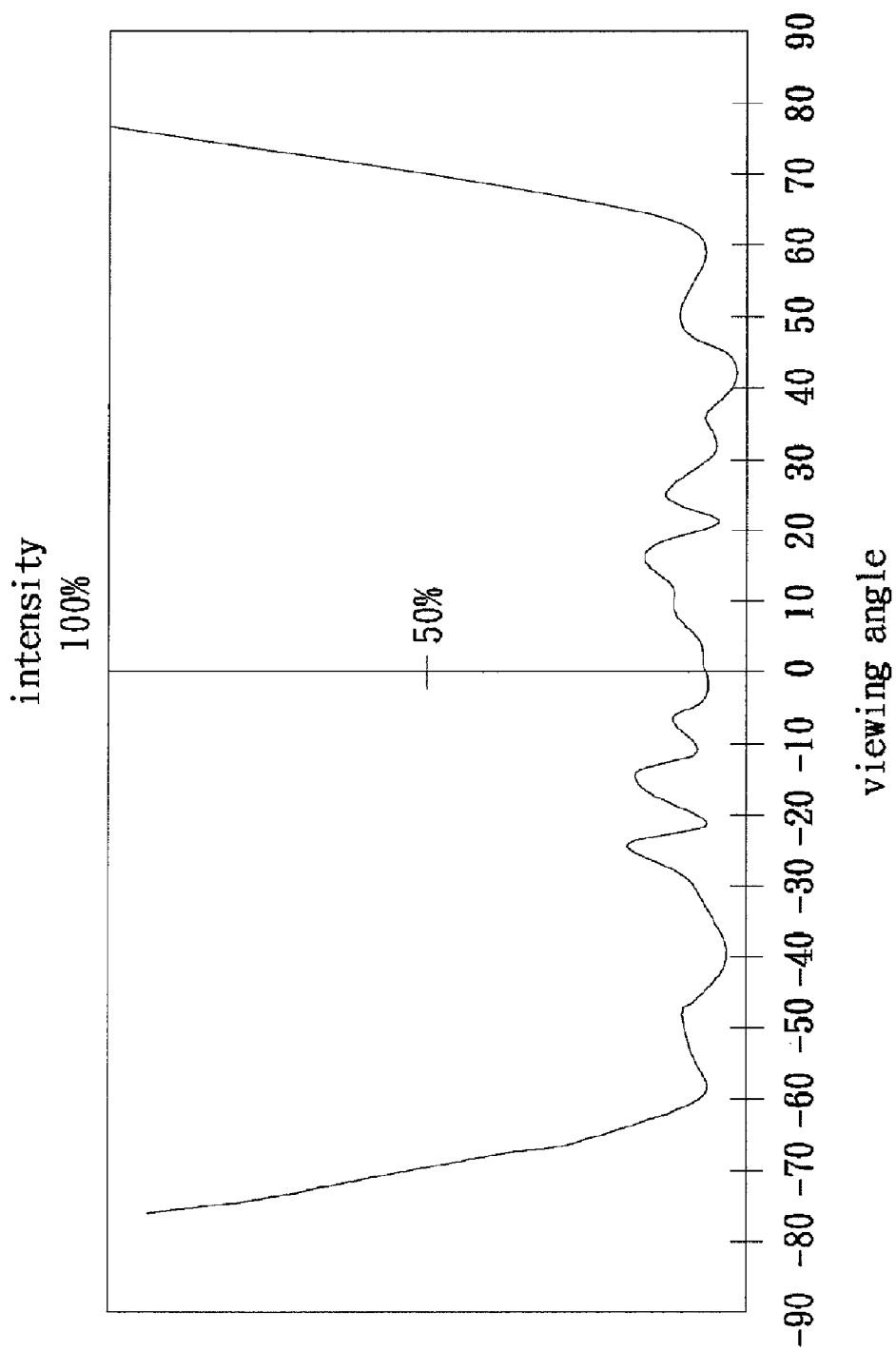
FIG. 7B illustrates the relationship between viewing angle and the intensity of light discharging out of a light source package structure of FIG. 7A.

Please refer to FIG. 7A and FIG. 7B, which are respectively a diagram used to define the viewing angle with reference to a light source package structure and diagram illustrating the relationship between viewing angle and the intensity of light discharging out of a light source package structure of FIG. 7A. In FIG. 7A, the central axis of the light source package structure is defined as 0 degree viewing angle while the left direction perpendicular thereto is defined as –90 degree viewing angle and the right direction perpendicular thereto is defined as 90 degree viewing angle. As seen in FIG. 7B, within the range of 60 degree and –60 degree viewing angles, the intensities of light emitted from the light source package structure of the invention are comparatively weak, and the intensities are detected to be much more intense when the viewing angle is exceeding the range of 60 degree and –60 degree. Therefore, it is obvious that the light source package structure is capable of enabling most of the light emitted thereby to be discharged in a direction almost perpendicular to the central axis thereof.

Figure 8A:
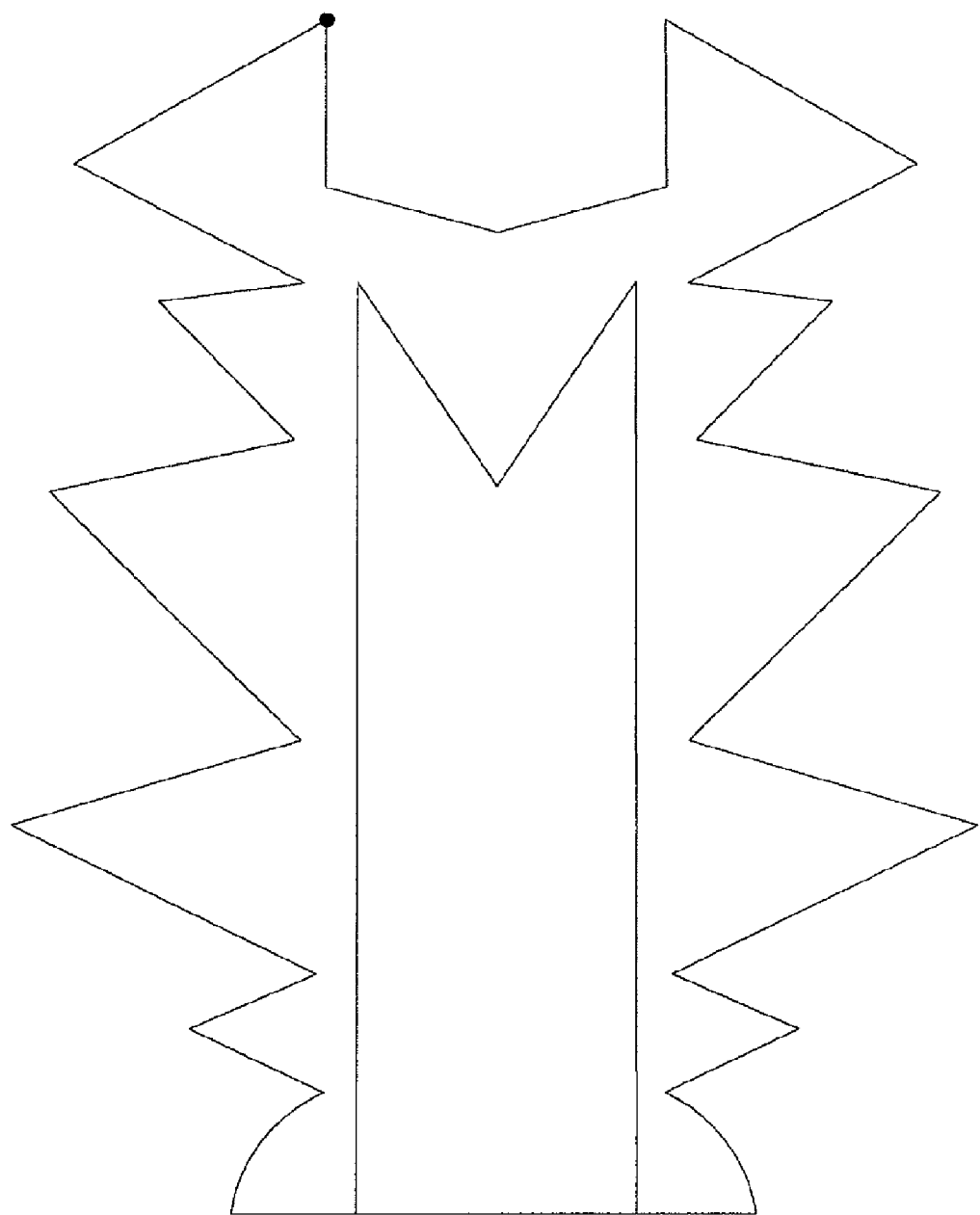
FIG. 8A is a cross sectional view of a light source package structure according to a fifth preferred embodiment of the invention.
Figure 8B:
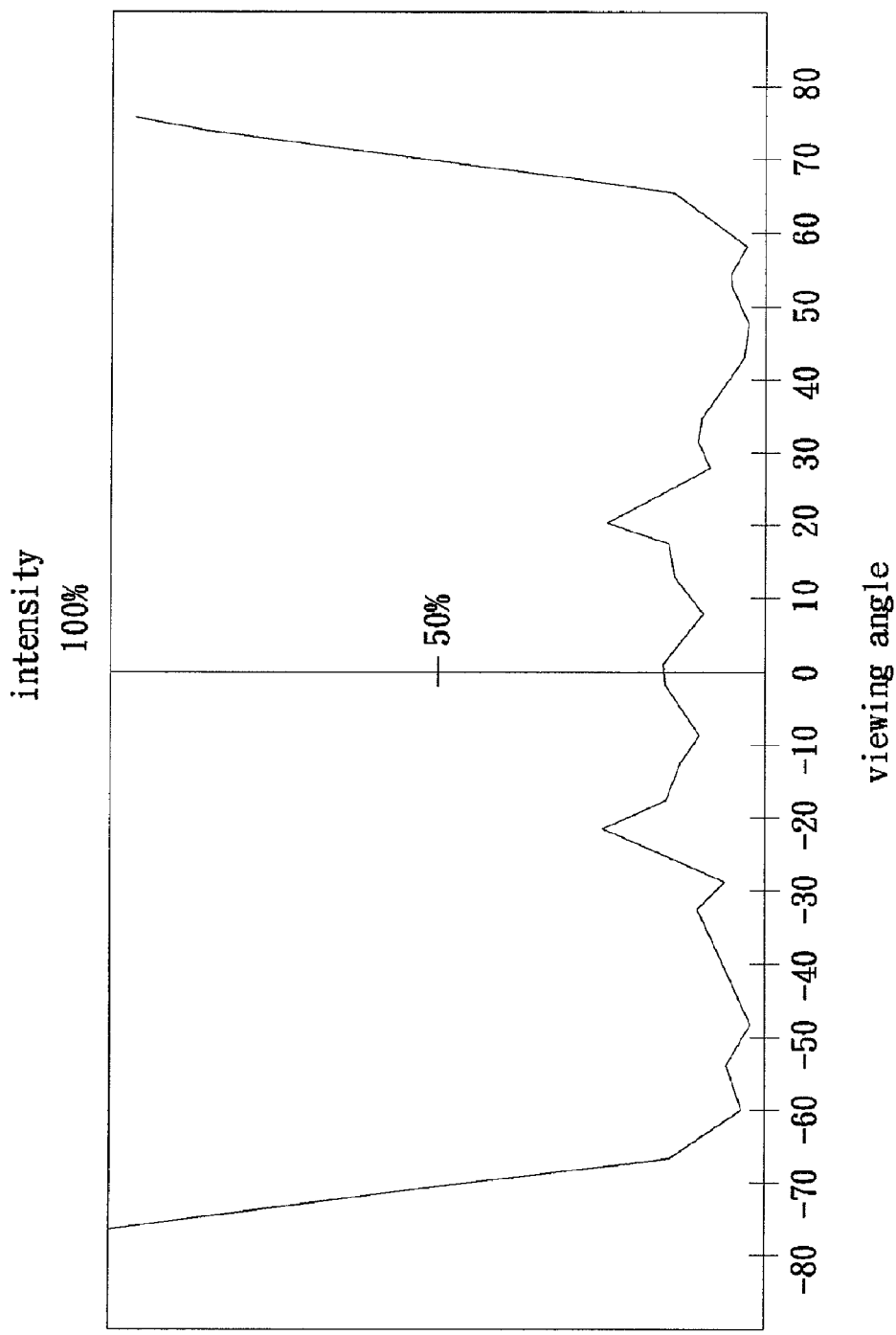
FIG. 8B illustrates the relationship between viewing angle and the intensity of light discharging out of a light source package structure of FIG. 8A.

Please refer to FIG. 8A, which is a cross sectional view of a light source package structure according to a fifth preferred embodiment of the invention. As seen in FIG. 8, instead of arranging a tapered structure at the upper portion of the first refraction surface, the top of the first refraction surface is indented, by which the overall height of the light source package structure can be reduced for enhancing the usability of the invention. In FIG. 8B, the relationship between viewing angle and the intensity of light discharging out of a light source package structure of FIG. 8A is similar to that shown in FIG. 7B and thus is not described further herein.

In a preferred aspect, a flat light source can be configured by arranging an array of the light source package structures in a matrix while the matrix is covered and sealed by a material of diffusion capability, such as a diffusion plate or diffusion film. In addition, a collimating plate can be selectively arranged superimposing the diffusion plate or diffusion film. The so-manufactured flat light source can have various usages, such as being employed in the backlight module of LCDs, being employed in an indoor light fixture, or being employed as the light source of a commercial billboard, but is not limited thereby. Moreover, it is relative easy to pack a light source with the light source package structure of the invention. As a hollow accommodating space is formed inside the first refraction surface, the packing can be achieved simply by wearing the light source package structure onto the light source. Therefore, the step of forming a lens on top of an LED while covering the same, and the specific pumping-suction step for filling the gap between the lens and the LED by a transparent material, both disclosed in U.S. Pat. No. 6,679,621, are no longer required.

While the preferred embodiment of the invention has been set forth for the purpose of disclosure, modifications of the disclosed embodiment of the invention as well as other embodiments thereof may occur to those skilled in the art.

Accordingly, the appended claims are intended to cover all embodiments which do not depart from the spirit and scope of the invention.

What is claimed is:

1. A light source package structure, comprising:
   an accommodating space, for accommodating a light source;
   a first refraction surface, for receiving light discharging from the light source while refracting the same to form a first refracting light;
   at least a second refraction surface, for receiving and refracting the first refracting light to form a first discharging light being emitted out of the light source package structure;
   a reflection surface, connected to the at least one second refraction surface, for reflecting the portion of the first refracting light emitted from a top of the first refraction surface while enabling the reflected first refracting light to incident to the second refraction surface; and
   a refraction package, disposed outside the second refraction surface while covering the same, wherein the refraction package further has a third refraction surface for receiving and refracting the first discharging light incident thereon to form a second refracting light and a fourth refraction surface for receiving and refracting the second refracting light and thus forming a second discharging light emitted out the of the refraction package.

2. The light source package structure of claim 1, wherein at least a round-tipped structure are formed at an upper portion of the first refraction surface.

3. The light source package structure of claim 1, wherein at least a taper structure are formed at an upper portion of the first refraction surface.

4. The light source package structure of claim 3, wherein the tapered structure is a structure selected from the group consisting of a pyramid and a corn.

5. The light source package structure of claim 1 wherein the first refraction surface is substantially the exterior of a first lens containing the accommodating space therein for enabling the exterior of the light source to be tightly attached to the interior of the accommodating space while sealing the same.

6. The light source package structure of claim 2, wherein the profile of the round-tipped structure is defined by one of the following shapes: arc, aspheric, lenticular and spherical.

7. The light source package structure of claim 1, wherein a layer of pervious-to-light material is coated on an exterior of the light source.

* * * * *